United States Patent [19]
McGrath et al.

[11] Patent Number: 5,357,040
[45] Date of Patent: Oct. 18, 1994

[54] FINE POWDERS OF KETONE-CONTAINING AROMATIC POLYMERS AND PROCESS OF MANUFACTURE

[75] Inventors: James E. McGrath, Blacksburg, Va.; Keith R. Lyon, Maplewood, Minn.; Richey M. Davis, Blacksburg, Va.; Ann Texier, Lille, France; Atilla Gungor, Istanbul, Turkey

[73] Assignees: The Center for Innovative Technology, Herndon; Virginia Polytechnic Institute & State University; Virginia Tech Intellectual Properties, Inc., both of Blacksburg, all of Va.

[21] Appl. No.: 22,049

[22] Filed: Feb. 24, 1993

[51] Int. Cl.$^5$ ................................. C08J 3/12
[52] U.S. Cl. ........................ 528/490; 528/480; 528/491
[58] Field of Search ............... 528/480, 490, 491

[56] References Cited

U.S. PATENT DOCUMENTS 4,933,056  6/1990  Corrigan et al. ............... 204/181.7

OTHER PUBLICATIONS

Mohanty et al, 32nd *Int. Sampe Symp*, 32:408 (1987).

*Primary Examiner*—Samuel A. Acquah
*Attorney, Agent, or Firm*—Whitham, Curtis, Whitham & McGinn

[57] ABSTRACT

Fine particles of semi-crystalline ketone-containing aromatic polymers (PEEK, PEKK, etc.) are produced by controlling the rate and conditions of hydrolysis of an amorphous polyarylketimine intermediate. The choice of acid and its concentrations affects the rate of ketimine hydrolysis and subsequent particle formation. In addition, zero or reduced amounts of agitation during hydrolysis has been found to promote the formation of smaller (submicron) sized particles which are spherical in shape, while greater amounts of agitation or shear stress applied during hydrolysis results in nonspherical, larger particles. Carbon fiber reinforced composites were made from aqueous suspensions of these particles that were dispersed or stabilized by a water soluble polymer.

5 Claims, No Drawings

FINE POWDERS OF KETONE-CONTAINING AROMATIC POLYMERS AND PROCESS OF MANUFACTURE

This invention was made with the aid of a grant from the Office of Naval Research (N00014-87-K-0261) and the U.S. Government may have certain rights in this invention.

BACKGROUND OF THE INVENTION

1. Field of the Invention

This invention generally relates to polymeric materials and, more particularly, to a chemical process for producing powders of ketone-containing aromatic polymers (polyarylketone polymers) of micron and submicron particle size.

2. Description of the Prior Art

Polyarylketone polymers are tough, semi-crystalline, poorly soluble materials with high melting temperatures. The crystallinity contributes to the excellent chemical resistance, mechanical properties, and extended use temperature above the glass transition temperature (Tg). This combination of material properties is desirable for engineering and structural applications. Typical examples of these materials include polyarylene ether ketone (PEK), polyarylene ether ether ketone (PEEK), polyarylene ether ketone ketone (PEKK), etc.

Polyarylketone polymers are produced by a number of different processes. The two traditional routes for the polymerization of these polymers are aromatic electrophilic substitution and aromatic nucleophilic substitution. The electrophilic substitution method suffers from the fact that it produces ortho substitutions as well as the desired para linkages. The conventional nucleophilic displacement reaction requires the use of high boiling solvents such as diphenylsulfone to prevent premature crystallization, and the removal of solvent and salt byproducts from the polymer has proven extremely difficult. In addition, the high reaction temperatures required (280°–320° C.) may lead to unwanted side reactions such as branching.

The production of linear polymers of semicrystalline polyether ketones without side reactions has been investigated by a number of researchers. Mohanty et al., 31*st Int. SAMPE Symp.*, 31:945 (1986), and Risse et al., *Macromolecules*, 23:4029 (1990), disclose a method to produce high molecular weight amorphous polymers by the incorporation of removable bulky alkyl susbstituents (e.g., t-butyl) along the polymer backbone. The alkyl groups are cleaved from the polymer backbone by strong acids to generate the semicrystalline polyether ketones. Cleavage of the alkyl groups is relatively slow (>20 hours) and requires the use of trifluoromethane sulfonic acid as a solvent. Kelsey et al., *Macromolecules*, 20:1204 (1987), discloses reacting the ethylene glycol acetal of dihydroxybenzophenone with difluorobenzophenone to form poly(ketal ketones). These poly(ketal ketones) were subsequently hydrolyzed to the polyether ketones. The Kelsey et al. reaction process is limited in its applicability to bisphenol monomers which contain ketone moieties since the ketal is not an electron withdrawing group and cannot activate a dihalide monomer toward polymerization. Mohanty et al., 32*nd Int. SAMPE Symp.* 32:408 (1987) discloses reacting 4,4'-difluorobenzophenone in the presence of molecular sieves with aniline to produce a ketimine derivative, when polymerized with a bisphenolate produces an amorphous poly(arylene ether ketimine). The ketimine is subsequently cleaved with dilute acid to regenerate the ketone.

The chemical and solvent resistance of polyarylketone polymers along with their high melting temperature (Tm) make processing of this material quite difficult. For example, impregnating carbon fiber pre-pregs with polyarylketones to form composite materials useful in engineering structures is presently performed by a number of time consuming and expensive techniques. There are several solvent based processes in which the carbon fibers are drawn through a solution of resin. With this type of method, one must be able to dissolve the polymer. Polyarylketone polymers such as PEEK require the use of high temperatures and exotic solvent systems to dissolve the polymer. The harsh conditions employed often break the carbon fibers during impregnation. Furthermore, the solvent systems employed are often toxic and difficult to isolate, as well as pose an environmental hazard. Another approach is to produce a continuous fiber of the polymer and to weave or commingle these fibers with the carbon reinforcement. For this approach, one must be able to produce the polymeric fiber and have a means for mixing these fibers with the carbon fibers and these requirements both involve major technical challenges and capital investments.

Recently, much effort has been made in preparing powders from engineering polymers. The powders can be applied onto a fiber by electrostatically charging the polymer powder and depositing it onto the fiber via a fluidized bed, or by pulling the fiber through a suspension, preferably aqueous, of the powder. After the powder is applied, heat is employed to fuse the powder to the fiber and to consolidate the powder. Powder pre-pregging has been investigated for LARC-TPI (see, Baucom et al., 35*th Int. SAMPE Symp.*, 35:175 (1990), Marchello, 36*th Int. SAMPE Symp.*, 36:68 (1991), and Hou et al., 35*th Int. SAMPE Symp.*, 35:1594 (1990)) and epoxy (see, Yang et al., 36*th Int. SAMPE Symp.*, 36:1523 (1991) ). The particle sizes reported for powder pre-pregging range from 5 μm (see, Thorne et al., 35*th Int. SAMPE Symp.*, 35:2086 (1990)) to 80 μm (see, Hedrick et al., 35*th Int. SAMPE Symp.*, 35:82 (1990)).

Presently, powders of polymeric materials are made by grinding the polymer. Grinding is very expensive and also imposes mechanical limits on the size of particles which can be obtained.

SUMMARY OF THE INVENTION

It is an object of this invention to provide a chemical method of attaining powders of polyarylketones of submicron and micron size.

It is another object of this invention to provide techniques for controlling particle size while forming powders of polyarylketones.

It is yet another object of this invention to provide powders and suspensions of polyarylketones for use with fiber prepregs, for thin film formation, and for forming mixtures with diverse polymer, metallic, and ceramic materials, etc.

According to the invention, polyarylketones are formed by polymerizing ketimine containing monomers, and then transforming the amorphous ketimine derivative to a semicrystalline polymer via hydrolysis under controlled conditions. The polymer precipitates due to its crystallinity and generates particles of the polymer without the need for grinding. The size of the particles produced can be controlled using different hydrolysis agents and varying amounts of agitation and shear during hydrolysis. Powderized polymers of particle sizes ranging between 0.5 μm and 5 μm can be produced by this technique.

Powders of polyarylketones have a wide variety of uses. For example, the powders can be used in advanced polymeric composites for applications where high strength and light weight are required (e.g., aircraft, turbines, automobiles, sports equipment, etc.). The powders can be electrostatically charged and applied to a carbon fiber or other fiber prepreg, or dispersed in a fluid (preferably water) and applied to a fiber prepreg by pulling the prepreg through the fluid suspension. After application to the fiber prepreg, heat is used to fuse the polymer to the fibers and consolidate the particles. Alternatively, the powders can be combined with copper or other metallic powders to form electrically conductive substrates. These substrates could be used in electronic circuit boards, in electromagnetic shielding, in antiradar applications, etc. The powders may also be combined with graphite powder, polytetrafluoroethylene (PTFE), fullerenes (Bucky Balls), and other materials to form shaped articles having surfaces with reduced friction. Likewise, the powders may be combined with platinum, palladium, and other catalysts, to form articles with catalytic surfaces. In addition, the powders may be combined with powderized ceramics to provide novel ceramic and superconductor materials. Composites, films, shaped articles, and the like, formed by heating the powder will provide the article produced with the mechanical and chemical stability inherent in polyarylketones.

DETAILED DESCRIPTION OF THE PREFERRED EMBODIMENTS OF THE INVENTION

A wide variety of polyarylketones can be produced via the same synthesis route disclosed in the following reaction sequence for forming polyarylene ether ether ketone (PEEK):

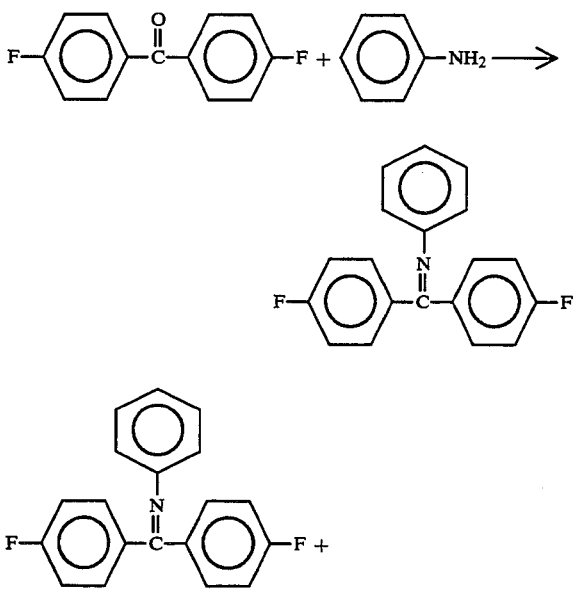

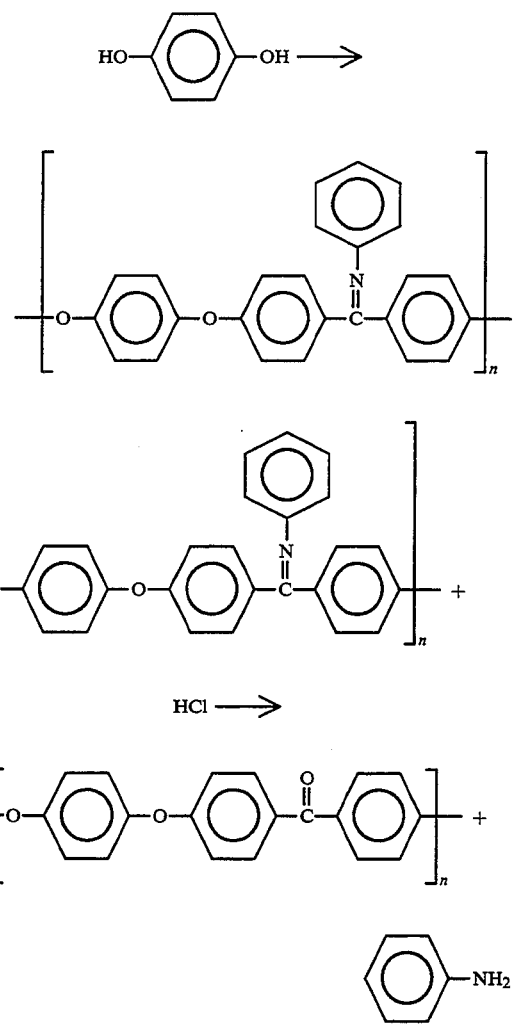

For example, instead of using hydroquinone as a precursor to forming the poly(arylene ether ketimine), a wide variety of bisphenolate and other compounds could be employed including the following:

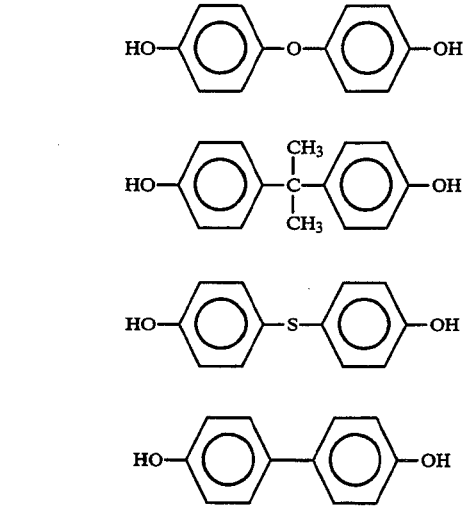

-continued

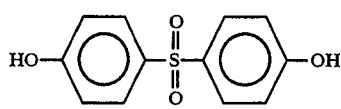

In addition, instead of using 4,4′-difluorobenzophenone (DFB) to form the ketimine containing monomer, a number of different dihalogenated aryl compounds could be employed including the following:

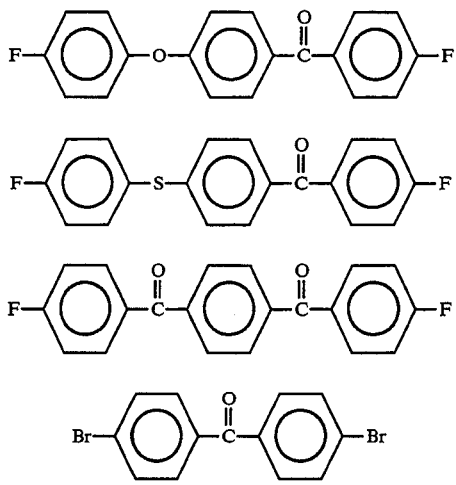

The reaction sequence can be used to produce a number of well known and accepted polyarylketones including PEEK, PEKK, etc., and can also be used to produce new and useful engineering materials.

The following experimental section sets forth the procedures for preparing powderized PEEK of submicron and micron particle size and for producing PEEK particles having different shapes and characteristics in a controlled fashion; however, it should be understood that the experimental section is for exemplary purposes only and that the procedures set forth can be practiced for producing powders of a wide variety of polyarylketones simply by varying the precursors.

EXPERIMENTAL

Materials

Monomer grade 4,4′-difluorobenzophenone (DFB) was donated by ICI, dried and used as received. Hydroquinone (HQ) was obtained from Aldrich Chemical, was recrystallized from water and vacuum dried. Bis aniline P was donated by Shell and used as received. High purity benzophenone tetracarboxylic acid (BTDA) was used as received from a commercial supplier. Polyamic acid of LARC-TPI produced by Mitsui Toatsu Chemicals was obtained from NASA. Dimethyl acetamide (DMAc), N-methyl-2-pyrolidone (NMP) and aniline were reagent grade from Fisher Scientific and were freshly distilled from calcium hydride under reduced pressure and stored under nitrogen. Potassium carbonate was dried by heating to 150° C. under vacuum and stored in a dessicator until used.

Preparation of Ketimine Containing Monomers

To a 4-neck round bottom flask equipped with a mechanical stirrer, condenser, thermometer, and nitrogen inlet was added 4,4′difluorobenzophenone (0.45 moles) and 300 ml of toluene. To this solution, aniline (0.68 moles) was added along with approximately 200 grams of 3Å molecular sieves. The reaction was heated and refluxed for 24 hours. After this time, the reaction product was filtered to remove the sieves and the filtrate was evaporated to dryness to remove the solvent and residual aniline. The resulting product was recrystallized from toluene and vacuum dried to yield bright yellow crystals (mp 108°–110° C.). This product, (DFBK$_t$) was then used as the activated dihalide monomer.

Synthesis of Poly(Arylene Ether)Ketimines

To a 500 ml 4-neck round bottom flask equipped with a mechanical stirrer, Dean Stark trap, thermometer and nitrogen inlet was added hydroquinone (0.09 moles). The polytetrafluoroethylene coated aluminum weighing pans and funnel were washed with DMAc to quantitatively transfer all the monomer. A 15% excess of potassium carbonate (K$_2$CO$_3$) (0.10 moles) was added followed by 180 ml DMAc. Toluene was added (45 ml) as an azeotroping agent to remove the water formed during the reaction. The reaction mixture was then heated under nitrogen flow to a temperature of 145° C.. The reaction was kept at this temperature until the system was totally dehydrated (approximately four hours). Then, the reaction temperature was raised to 155° C. by removal of toluene from the reaction via the Dean Stark trap. The reaction was allowed to proceed at 155° C. for eight hours. After the reaction was complete, as judged separately by a constant intrinsic viscosity, the mixture was filtered to remove the salts, precipitated in an organic solvent, and was dried under vacuum overnight. The polymer was then redissolved in chloroform and re-precipitated into methanol in a high speed blender, filtered and dried under vacuum to a constant weight. The resulting yellow polymer was defined as poly(ether ether ketimine) (PEEK$_t$).

Cleavage of the Ketimine Containing Polymers

In a 250 ml Erlenmeyer flask with a magnetic stir bar was added 25 g of ketimine polymer, and to this was added 125 ml NMP to dissolve the polymer. A fourfold excess of water based upon the stoichiometric amount of ketimine was added (1–3 ml). To the stirring polymer solution was added a dilute aqueous acid solution (e.g., HCl solution (6 ml in 50 ml NMP)). The solution was stirred until the semicrystalline polymer precipitated from the solution as a fine powder. At this point, the polymer was washed with water followed by filtration a number of times until the pH of the water was neutral. The resulting polymer was then dried in vacuum above Tg for 2 hours.

Suspension Prepregging

Prepregging was done using a Research Tool Corporation Model 30 Prepregger designed originally for solution and hot melt prepregging and modified by designing a new resin pot which made it possible to do suspension powder prepregging. Treated unsized AS-4 12K carbon fibers from Hercules were used.

Composite Consolidation and Characterization

The composite panels were consolidated using a Tetrahedron Pneumopress P400 pneumatic hot press. Pressure cycling was used to facilitate the removal of volatiles during the consolidation step.

The composite panels were evaluated using different tests. C-scan was performed using an S-80 C-Scan unit. Mechanical tests were performed using an Instron testing machine Model 4204 operating using ASTM procedures D-790-86 (flexure test) and D-3039 (transverse tensile test).

RESULTS

Defect-free semicrystalline poly(arylene ether) ketones can be synthesized in high yield at moderate temperatures (155° C.) using amorphous ketimine precursors. The large pendent ketimine moiety prevents the precursor polymer from being able to pack into a crystal lattice, therefore rendering the polymer amorphous. The ability to prevent the crystallization gives one the advantage of using lower temperatures and more conventional solvents.

As discussed above, the hydrolysis of the amorphous precursor to the semicrystalline polymer was performed by the addition of acid. It was found that the kinetics of the hydrolysis can be controlled by the amount and type of acid used. Table 1 provides kinetic data for the hydrolysis of 20 g (0.055 moles) PEEK$_t$ in 100 ml NMP using different concentrations of HCl and using acetic acid.

TABLE 1

| Amount of Acid | Moles of Acid | Ratio of Moles Ketimine to Moles Acid | Time for Cleavage* |
| --- | --- | --- | --- |
| 3 ml HCl | 0.036 | 1.53 | 30 sec. |
| 1 ml HCl | 0.012 | 4.59 | 15 min. |
| .5 ml HCl | 0.006 | 9.18 | ~1 hour |
| .12 ml HCl | 0.001 | 38.2 | ~3 hour |
| 3 ml Acetic acid | 0.052 | 1.04 | no cleavage >10 days |

*End time was the point when stirring was no longer possible due to the polymer coming out of solution.

Table 1 shows that if 1–3% HCl is used, the reaction proceeds and is complete in a matter of minutes. However, if lower concentrations of HCl are chosen, the reaction may proceed for literally hours before completion. With acetic acid, even after 10 days, only 30% of the polymer is hydrolyzed.

Formation of particulates of the polyarylketones takes place during the hydrolysis step. As the precursor starts to hydrolyze, the resulting ketone containing copolymer can start to crystallize. As this ordering proceeds, the polymer becomes increasingly more crystalline, less soluble, and generates particulates.

The conditions under which hydrolysis is performed dictates the particle size and shape. If the hydrolysis is conducted with little or no stirring, the particles are spherical and can be made as small as 0.5 μm in diameter. With agitation, the size of the particles can increase to the order of 5 μm. Under conditions of high shear, the particles tend to aggregate and adhere to one another and appear as large masses instead of separate spherical entities.

Hence, by controlling the concentration of the acid, which regulates the speed of hydrolysis, and by controlling the degree of agitation during hydrolysis of the ketimine containing polymers, powders of the polyarylketones of particular sizes and shapes can be produced.

The PEEK powders form very unstable dispersions and the particles tend to aggregate. Thus, the addition of a stabilizer is necessary to form a stable suspension and break up the aggregates. A typical median aggregate size after the addition of the stabilizer was 15 μm.

The polyamic acid of LARC-TPI and the polyamic acid of Bis-P-BTDA polyimides at both 10,000 and 20,000 number average molecular weight were investigated for use as stabilizers, and these polyamic acids were treated with excess ammonium hydroxide to render them water soluble. Table 2 summarizes the mechanical properties of composites produced from PEEK powderized resin.

TABLE 2

| # | Dispersant | Resin Content w/w | Flexure Strength ksi | Flexure Modulus Msi | Tn Tens. Strength ksi |
| --- | --- | --- | --- | --- | --- |
| 1 | LARC-TPI | 56% | 118 | 8.5 | — |
| 2 | LARC-TPI | 56% | 125 | 9.0 | — |
| 3 | LARC-TPI | 56% | 128 | 9.2 | — |
| 4 | LARC-TPI | 49% | — | — | 10.6 |
| 5 | BisP-BTDA | 28% | — | — | 8.5 |
| 6 | BisP-BTDA | 32% | — | — | 10.6 |
| ICI-APC2 | N/A | 32% | — | — | 13.7 |
| ICI-APC2 | N/A | 32% | 273 | 17.5 | 11.6 |

It was observed that the composites made with LARC-TPI polyamic acid and PEEK showed brittle fracture failure in the transverse test whereas the composites made with the BisP-BTDA polyamic acid and PEEK showed ductile failure. The brittle failure of the composites with LARC-TPI polyamic acid was probably due to the immiscibility of LARC-TPI and PEEK in which both the carbon fiber and the PEEK powders are covered. This would then exclude the PEEK matrix resin from attaining intimate contact with the fiber. The composites fabricated using the BisP-BTDA, which is miscible with PEEK, show better wetting of the carbon fiber. The composite made with 20K Bis P-BTDA compares favorably with the commercial APC-2 control. This is probably due to the higher molecular weight of the polyamic acid that is achieved upon the treatment with ammonium hydroxide, therefore giving better mechanical strength.

A number of different stabilizers could be used for breaking up the polyarylketone aggregates including: hydroxypropylcellulose, the sodium salt of polymethacrylic acid, and polyvinylalcohol.

CONCLUSIONS AND APPLICATIONS

The experiments described above demonstrate that small particles (5 micron to submicron size) of semicrystalline PEEK can be prepared using ketimine precursors. The particle size is much smaller than any of the PEEK powders previously reported, and these powders can be made without a costly grinding step. In addition, the experiments demonstrate that the size and shape of the PEEK particulates can be controlled by proper selection of acid and acid concentration as well as by the use or non-use of agitation during hydrolysis.

Many other polyarylketone polymer powders can be prepared by the same process simply by using different precursor materials.

The polyarylketone polymer powders have a wide variety of uses.

For example, the powders can be used to prepare thermoplastic carbon-fiber or other fiber reinforced laminates. These composites are of interest in a variety of end uses where high strength and light weight are important, for example, military and civilian aircraft, rotating equipment such as turbine engines, compressors, pumps, automotive components, sports equipment, etc. The fiber reinforced laminates can be formed by electrostatically charging the powder and applying it to the fiber prepreg, or by dispersing it in a fluid (preferably water, but organic fluids such as toluene might also be employed) and applying it to a fiber prepreg by pulling the prepreg through the fluid suspension. After application to the fiber prepreg, heat is used to fuse the polymer to the fibers and consolidate the particles. Typically, 30–40 wt % of a composite is comprised of a polymer resin. The small size of the particles produced by this technique (0.5–5 $\mu$m) is advantageous because the powder particle sizes are comparable to or smaller than the usual fiber diameter of about 8 $\mu$m. This ensures good penetration of the powder into the tow so that high quality laminates can be produced. Table 2 shows that carbon fiber reinforced composites made from a suspension of PEEK powder dispersed with miscible Bis P-BTDA polyamic acid shows comparable properties to that of the commercial APC-2-PEEK composites. However, the present technique has the advantage that the composite was prepared from an aqueous suspension without the need of toxic solvents. This technique is far superior to grinding because it is not as expensive and, more importantly, grinding produces particles that are much larger (15–80 $\mu$m). These larger sized particles cannot effectively penetrate into the fiber tows and thus produce poorer quality laminates with non-uniform distribution of resin.

The polyarylketone powders could be combined with copper or other metallic powders to form electrically conductive substrates. These substrates could be used in electronic circuit boards, in electromagnetic shielding, in antiradar applications, etc. A conductive substrate would typically require 10–40 wt % of the conductor (at 30%, percolation conditions exist) and 60–90 wt % of the polymer. The polyarylketone powders could be combined with the metallic powders in dry form using a mixer, or both powders could be dispersed in a fluid which would be stirred to uniformly distribute the metallic and polyarylketone powders.

The polyarylketone powders may also be combined with graphite powder, polytetrafluoroethylene (PTFE), fullerenes (Bucky Balls), and other materials to form shaped articles having surfaces with reduced friction. The powders could be combined in dry or fluid form and articles produced by this technique would typically have a weight ratio of polyarylketone powder:surface agent ranging between 10:1–1:10.

Likewise, the polyarylketone powders may be combined with platinum, palladium, and other catalysts, to form articles with catalytic surfaces. The powders could be combined in dry or fluid form and articles produced by this technique would typically have a weight ratio of polyarylketone powder:catalyst ranging between 10:1–1:10.

In addition, the polyarylketone powders may be combined with powderized superconductive ceramics, such as Yttrium Barium Copper Oxides (YBaCuO), to provide novel superconductor materials. The powders could be combined in dry or fluid form and articles produced by this technique would typically have a weight ratio of polyarylketone powder:superconductor ranging between 10:1–1:10.

Likewise, the polyarylketone powders may be combined with powderized ceramics to provide novel materials for circuit board and other applications. Examples of typical ceramic powders which could be combined with the polyarylketone powders of this invention include silicon carbide (SIC), silicon oxides, lithium aluminum silicates, barium titanates, $(Ca_{1-x}Mg_x)Zr_4(PO_4)_6$ (CMZP), various glasses, etc. The powders could be combined in dry or fluid form and articles produced by this technique would typically have a weight ratio of polyarylketone powder:ceramic ranging between 10:1–1:10.

The polyarylketones may also be used as binder powders for highly filled components. Structural members formed with polyarylketone powders could include 30–50% of a metallic powder, ceramic or the like. Close packing is achieved when the metallic powder, ceramic, etc., is present at 50–70 wt % in the composition with polyarylketone powder.

Composites, films, shaped articles, and the like, formed by heating the powders will provide the article produced with the mechanical and chemical stability inherent in polyarylketones. A particular advantage of the composites made with the PEEK powders described above is that they yield machinable items with low coefficients of thermal expansion.

While the invention has been described in terms of its preferred embodiments, those skilled in the art will recognize that the invention can be practiced with modification within the spirit and scope of the appended claims.

We claim:

1. A method of preparing particles of polyarylketones, comprising the steps of:
   preparing an amorphous polyarylketimine precursor;
   hydrolyzing said polyarylketimine precursor; and
   controlling the hydrolyzing conditions during said hydrolyzing step to produce particles of polyarylketones of a particular size and shape.

2. The method of claim 1 wherein said controlling step includes preventing or reducing agitation of said polyarylketimine precursor during said step of hydrolyzing.

3. The method of claim 1 wherein said controlling step includes using 1–3% HCl for said hydrolyzing step.

4. The method of claim 1 further comprising the step of adding a stabilizer to said particles of polyarylketones to deaggregate said particles.

5. The method of claim 1 wherein said step of controlling produces particles of polyarylketones between 0.5 and 5 $\mu$m in size.

* * * * *